(12) United States Patent
Clevenger et al.

(10) Patent No.: US 6,632,741 B1
(45) Date of Patent: Oct. 14, 2003

(54) SELF-TRIMMING METHOD ON LOOPED PATTERNS

(75) Inventors: Lawrence A. Clevenger, LaGrangeville, NY (US); Louis Lu-Chen Hsu, Fishkill, NY (US); Jack A. Mandelman, Stormville, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 09/619,664

(22) Filed: Jul. 19, 2000

(51) Int. Cl.[7] ............................................. H01L 21/302
(52) U.S. Cl. ....................... 438/689; 438/696; 438/706; 438/723; 438/724; 438/725
(58) Field of Search ................... 438/706, 723, 438/724, 725, 756, 757, 689, 696

(56) References Cited

U.S. PATENT DOCUMENTS

| | | | | |
|---|---|---|---|---|
| 5,037,777 A | * | 8/1991 | Mele et al. ................... | 438/632 |
| 5,286,993 A | * | 2/1994 | Lowrey et al. .............. | 257/390 |
| 5,328,810 A | * | 7/1994 | Lowrey et al. .............. | 430/313 |
| 5,888,904 A | * | 3/1999 | Wu ............................. | 438/682 |
| 5,923,981 A | * | 7/1999 | Qian ........................... | 438/284 |
| 6,010,933 A | * | 1/2000 | Cherng ........................ | 438/253 |
| 6,011,291 A | * | 1/2000 | Russell et al. .............. | 257/347 |
| 6,081,010 A | * | 6/2000 | Sanchez ...................... | 257/345 |
| 6,287,957 B1 | * | 9/2001 | Linliu ......................... | 438/634 |

\* cited by examiner

*Primary Examiner*—Benjamin L. Utech
*Assistant Examiner*—Binh X. Tran
(74) *Attorney, Agent, or Firm*—Richard M. Ludwin, Esq.; McGinn & Gibb, PLLC

(57) ABSTRACT

A method of self-trimming pattern, includes forming a pattern containing a plurality of regular or irregular features within a first material deposited on a substrate, depositing a conformal layer of second material, and etching the second material to form spacers of the second material along the sidewalls of the features in the first material.

29 Claims, 7 Drawing Sheets

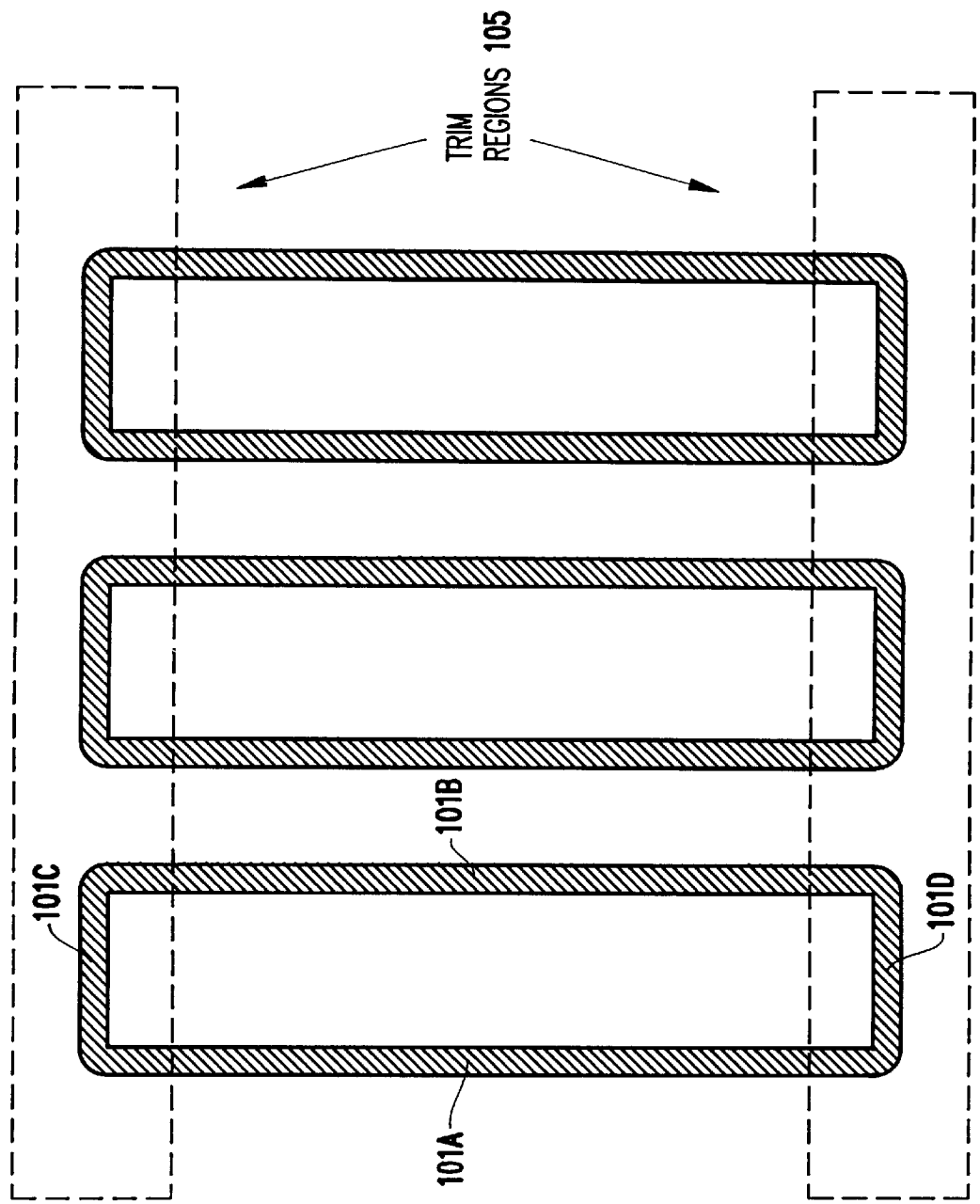

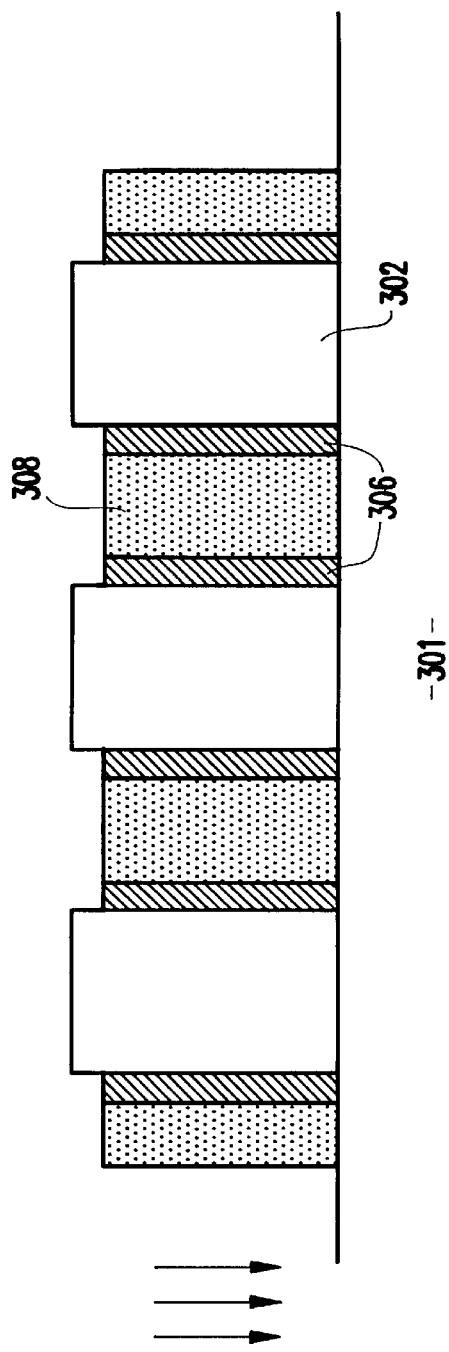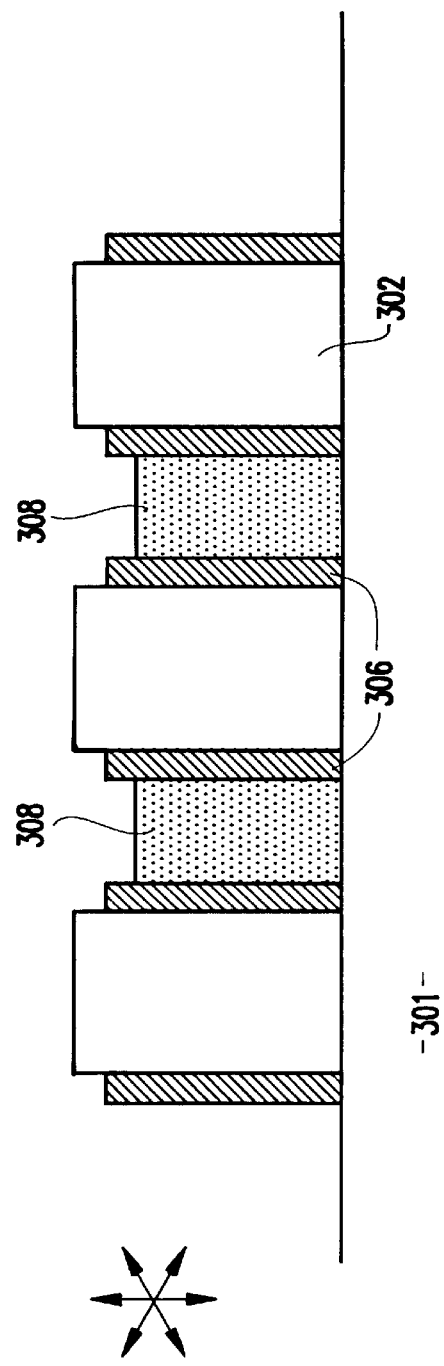

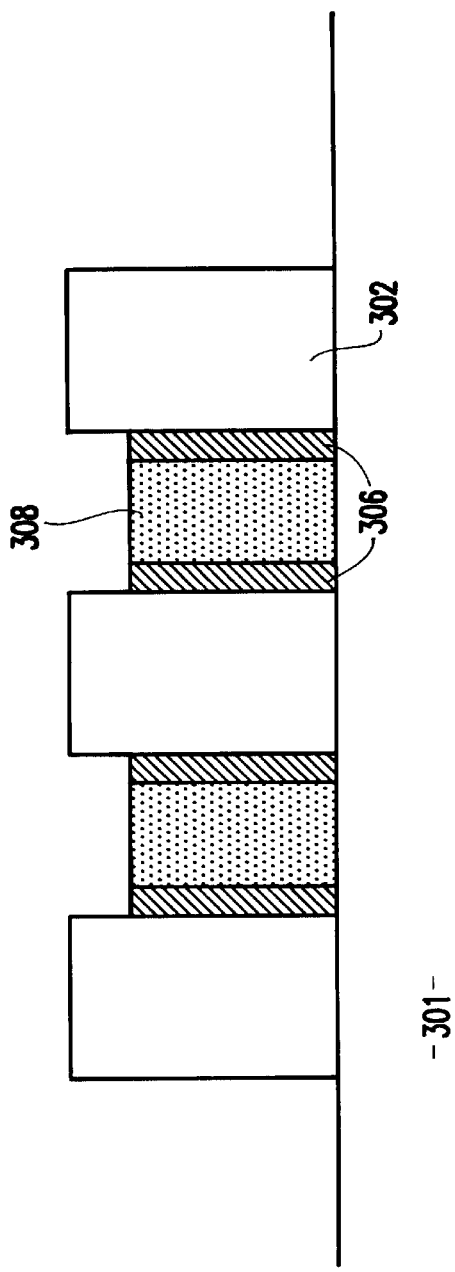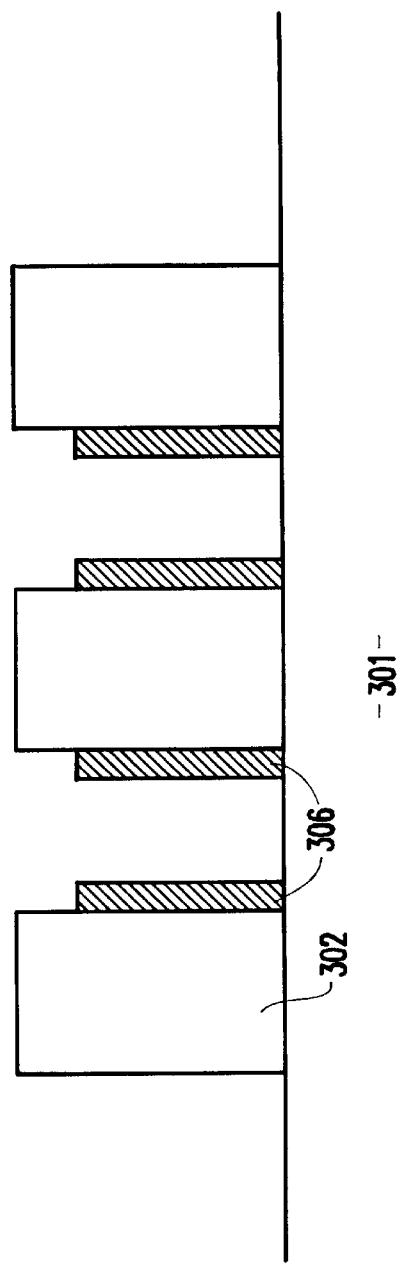
FIG.7
FIG.8

SELF-TRIMMING METHOD ON LOOPED PATTERNS

CROSS-REFERENCE TO RELATED APPLICATION

The present application is related to U.S. Pat. No. 6,399,447 B1, issued Jun. 4, 2002, to Clevenger et al., entitled "METHOD OF PRODUCING DYNAMIC RANDOM ACCESS MEMORY (DRAM) CELL WITH FOLDED BIT-LINE VERTICAL TRANSISTOR", assigned to the present assignee, and incorporated herein by reference.

BACKGROUND OF THE INVENTION

1. Field of the Invention

The present invention relates to a method for processing a semiconductor device, and more particularly to a method for self-trimming patterns (e.g., looped patterns) formed by techniques such as using sidewall spacers, sidewall image transfer, or phase edge image transfer via a phase shift mask (e.g., normally requiring a trim mask to separate the resulting pattern) without using a trim mask.

2. Description of the Related Art

Processing of semiconductor devices typically involves formation of patterns (e.g., looped patterns) formed by techniques such as using sidewall spacers, sidewall image transfer, or phase edge image transfer via a phase shift mask. To separate such looped patterns, typically a trim mask is used to separate the pattern (e.g., see FIG. 2).

However, the trim process is an extra lithographic step which involves a photo mask and related process steps, such as resist coating, exposure, developing, and stripping, etc. The trim process results not only in higher cost, but also a higher probability of contamination. Thus, while the looped patterns are useful, especially since they can result in a sub-lithographic pattern which separately could enhance the device packing density without relying on expensive lithographic techniques, the looped pattern requires the trim mask.

Therefore, using such looped patterns without requiring a trim mask would be helpful in the semiconductor industry. Hitherto the present invention, such has not been accomplished.

It is noted that an existing process which performs trimming and avoids using a mask is described in copending U.S. patent application Ser. No. 09/224,768, to Arndt, et al., having IBM Docket No. FI9-98-147, filed on Jan. 4, 1999 entitled "METHOD OF PRODUCING SELF-TRIMMING SUBLITHOGRAPHIC ELECTRICAL WIRING".

In the copending application, a recess in a deposited layer is created such that selected sides of the recess have sloped sidewalls and the remaining sides of the recess have vertical sidewalls. A phase-shifted region of the mask used to define the recess produces the sloped sidewalls, while the vertical sidewalls result from the non-phase shifted portion of the mask. Sidewall spacers form only on the steep sidewalls of the structure.

Hence, no looped pattern will be formed, and there is no need for trimming. However, this method requires an expensive mixed phase mask. Furthermore, since shallow slopes are involved in the pattern layout, the packing density is limited.

Thus, prior to the present invention, there has been no method which avoids the use of a separate trim mask to define the portion of a looped pattern to be trimmed. Thus, the conventional techniques have been costly and inefficient.

SUMMARY OF THE INVENTION

In view of the foregoing and other problems, disadvantages, and drawbacks of the conventional methods and structures, an object of the present invention is to provide a method in which looped patterns are processed without requiring a trim mask.

Another object is to provide a method for performming a maskiess, or self-trimming processing of such looped patterns, so that they can be useful for different applications, such as forming conductors, resistors, fuses, etc.

In a first aspect of the present invention, a method of self-trimming a pattern includes forming a pattern containing a plurality of regular or irregular densely packed features using a first material deposited on a substrate, forming sidewall spacers using a second material along the sidewalls of the pattern in the first material, depositing and etching back a third material, such that the third material covers a portion of the sidewall spacers, and etching to remove the uncovered portion of the sidewall spacers.

In a second aspect of the present invention, a method of self-trimming a pattern includes forming a pattern within a first material deposited on a substrate, depositing a conformal layer of a second material, and etching the second material to form spacers of a second material along the sidewalls of predetermined patterns in the first material.

Preferably, the method further includes depositing a third material to fill spaces of the pattern in the first deposited material, and etching back the third deposited fill material to expose the patterns at exterior boundaries, the etching back partially removing the third deposited material from between adjacent lines of the first material, and the method further including removing the exposed patterns via an etching, and stripping the remaining third deposited fill material.

With the unique and unobvious aspects of the invention, patterns (e.g., looped patterns) can be used without requiring a trim mask. Further, no expensive phase-shift mask is required, as in the copending U.S. patent application Ser. No. 09/224,768. Additionally, the invention provides a high packing density. Thus, in the invention, a method is provided which avoids the use of a separate trim mask to define the portion of the looped pattern to be trimmed. Hence, the invention offers significant cost savings over the existing techniques.

Further, besides trimming the looped pattern, the method is flexible, and can trim other kinds of patterns depending on the layout design. These other patterns include, for example, a fish-bone shape, a comb shape, etc.

BRIEF DESCRIPTION OF THE DRAWINGS

The foregoing and other purposes, aspects and advantages will be better understood from the following detailed description of a preferred embodiment of the invention with reference to the drawings, in which:

FIG. 2 illustrates a top-down view of array with sidewall conductors and regions requiring trimming;

FIGS. 3A–9 illustrate a method according to a preferred embodiment of the present invention, and more specifically:

FIGS. 3A–3C illustrate cross-sectional views of forming an array with sidewall spacers 306, in which FIG. 3A illustrates lithography and etch of a mandrel 302, FIG. 3B illustrates deposition of a conductor film 304, and FIG. 3C illustrates a cross-sectional view of the array with sidewall spacers 306;

FIG. 4 illustrates a deposition of a conformal gap fill blocking film 308;

FIG. 5 illustrates an (optional) anisotropic gapfill etchback;

FIG. 6 illustrates an isotropic gapfill etchback;

FIG. 7 illustrates an isotropic spacer etching/stripping;

FIG. 8 illustrates a gapfill/mandrel film stripping; and

FIG. 9 illustrates a top-down view of an array with sidewall spacers formed by the method of the preferred embodiment of the present invention.

DETAILED DESCRIPTION OF A PREFERRED EMBODIMENT OF THE INVENTION

Figures 1A, 1B:
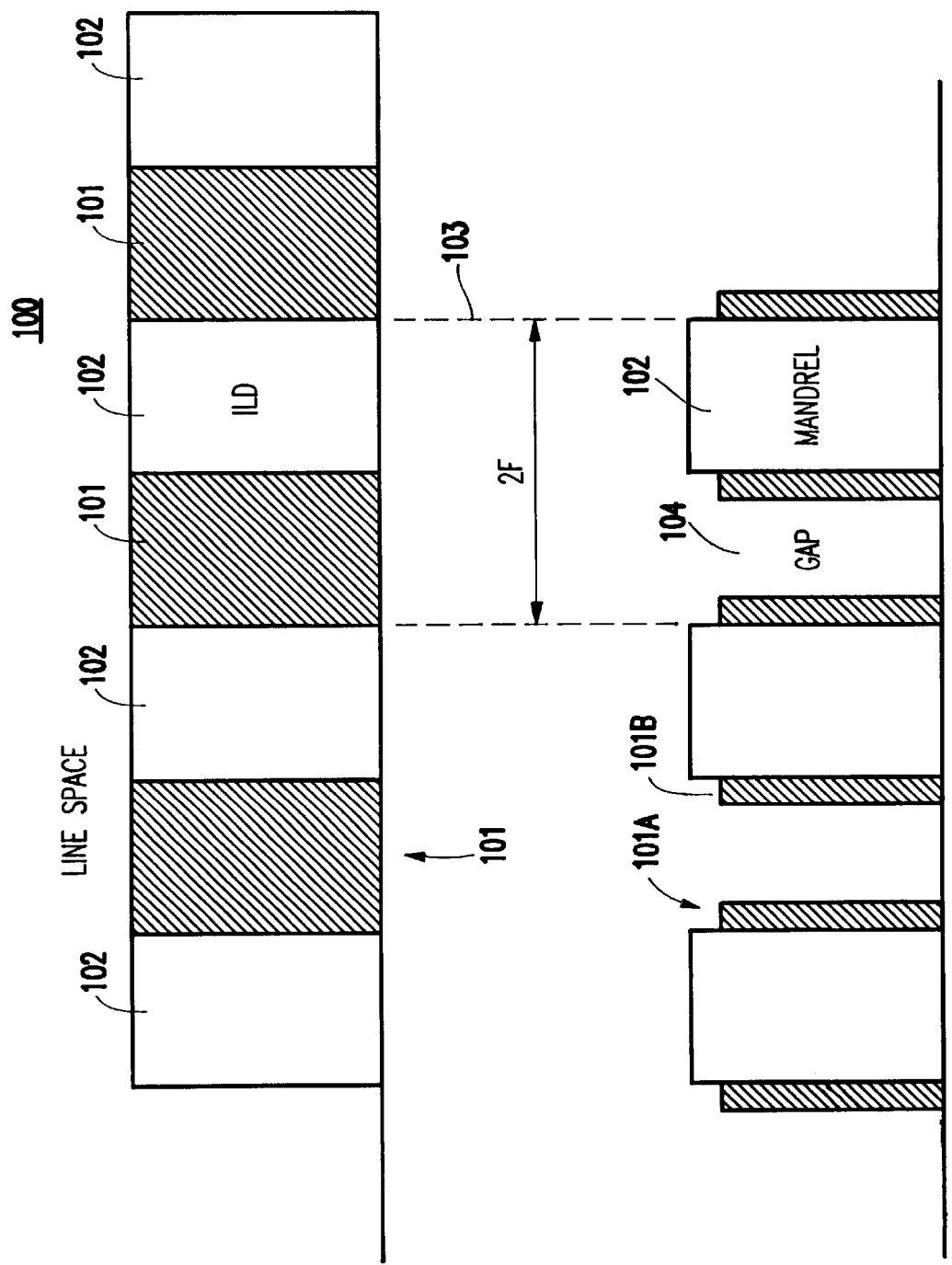
FIGS. 1A and 1B respectively illustrate an at-pitch conventional conductor 101 and a half-pitch sidewall conductor having portions 101A, 101B.

Referring now to the drawings, and more particularly to FIGS. 1A–9, there is shown a preferred embodiment of the method and structure according to the present invention.

PREFERRED EMBODIMENT

A cross-sectional view of a conventional line/space pattern 100 formed of, for example, an electrically conductive material 101, and an electrically insulating material 102, is shown in FIG. 1A. It is noted that, in the invention, the conducting material and insulating material could be changed (e.g., an analog arrangement could be produced to what is shown in FIGS. 1A–9) to the other. The conducting material 101 may be a metal such as Al, W, TiN, Cu, TiW, Ta, polysilicon, or some combination of electrically conductive materials. The insulating materials 102 between the conductors 101 may be a dielectric such as silicon dioxide, CVD oxide, TEOS, doped glass, or polymers.

The line/space pattern 100 of conductors may be formed using conventional photolithography technique such as imaging of a photoresist mask to a metal layer followed by metal etching such as reactive ion etching (RIE), and deposition of a interlevel dielectric (ILD) such as silicon dioxide. The line spaces are formed on an underlayer substrate (not referenced in the FIGS). Alternatively, a damascene technique may be used to form the line/space pattern where photolithography is used to form a series of grooves into a silicon dioxide layer, a metal conductor is deposited, and a chemical mechanical planarization/polishing (CMP) is used to remove the metal except in the grooves in the silicon dioxide layer.

The spatial interval of the line/space pattern is referred to as the "pitch" (e.g., reference numeral 103 in FIG. 1B), and the pitch 103 comprises two units of the minimum lithographically resolved feature size (e.g., line or space width) which is referred to as "F"(feature). Thus, the pitch is 2F, as shown in FIGS. 1A and 1B.

In FIG. 1B, a cross sectional view of a "half-pitch" sidewall conductor structure is shown. That is, within a single 2F pitch, there are two conductors 101A, 101B contained within the 2F interval.

The sidewall conductors 101A, 101B which are shown in FIG. 1B may be formed using conventional sidewall spacer processing techniques, such as lithographic definition of the at-pitch 2F line/space grooves in the ILD (or mandrel) material, and conformal deposition of a conductor material such as tungsten to a thickness which is less than half of the space 104 (e.g., gap) between the patterned ILD/mandrel 102. Then, an anisotropic etch such as RIE is performed which will remove the conductor material from the horizontal surfaces, but will leave a sidewall spacer 101A, 101B of the material along the exposed vertical surfaces, as shown in FIG. 1B and FIG. 3.

A top-down view of the array with sidewall conductors 101A, 101B from FIG. 1B is shown in FIG. 2. As shown, each conductor 101A, 101B forms a loop. Typically, it is desirable to remove the top 101C and the bottom 101D of the loop.

A trim mask may be used as indicated by the trim regions 105 with the dotted line. The trim mask may include a lithographically-defined opening through which the top 101C and the bottom 101D of the loops are removed. A key feature and advantage of the present invention is that it eliminates the need for a distinct lithographic masking level to trim the loop regions of the conductors 101A, 101B.

Figure 3A:
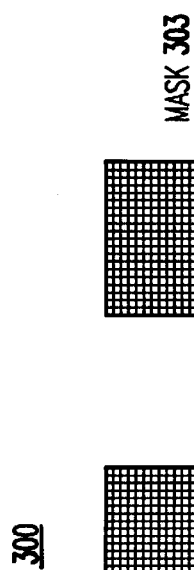
Figure 3B:
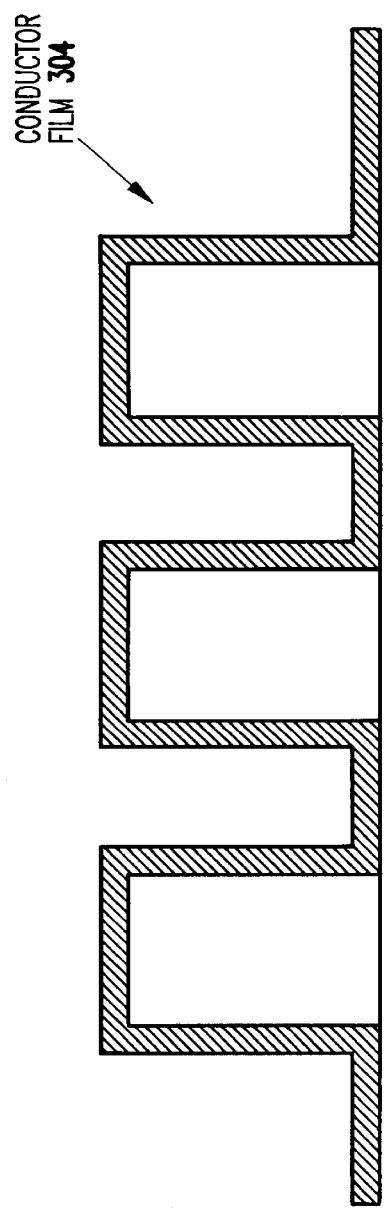
Figure 3C:
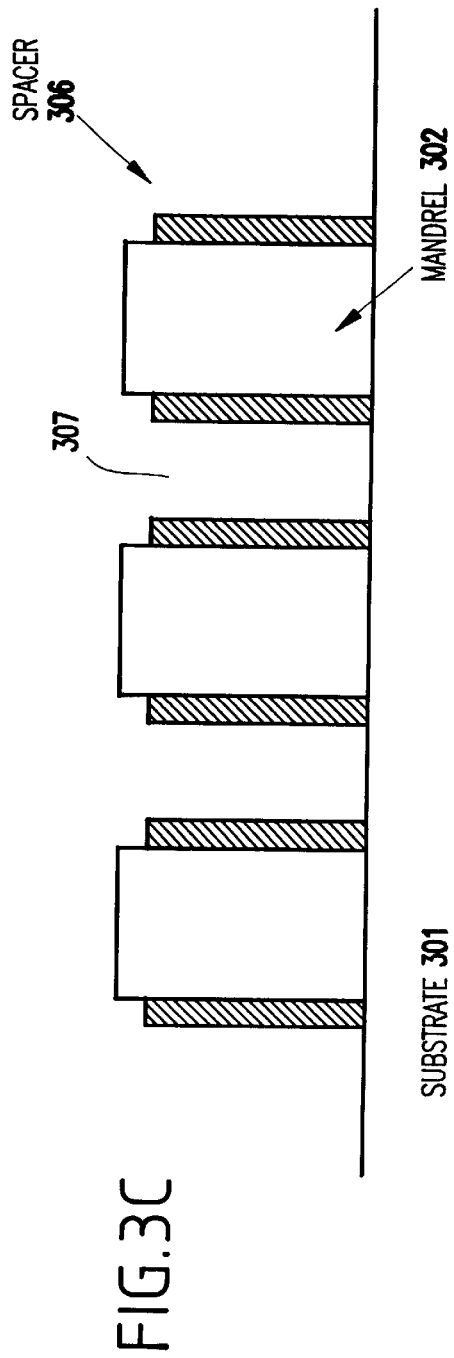

Turning now to the process of the invention, a cross-sectional view of an array 300 with sidewall spacers is shown in FIGS. 3A–3C, according to the present invention.

In FIG. 3A, a substrate 301 is shown preferably formed of a dielectric or the like. A mandrel material 302 such as silicon dioxide, silicon nitride, dielectric material, or the like is patterned using photolithography to image a photoresist mask 303, and RIE to etch the mandrel 302. It is noted that the mandrel could be formed of conductive material so long as the spacer material was insulative.

In FIG. 3B, a conformal conductive film 304, such as Al, W, TiN, Cu, TiW, Ta, polysilicon or some combination of electrically conductive materials including one or more of the above materials, is deposited over the patterned surface.

In FIG. 3C, an anisotropic (directional) etch such as RIE is used to remove the conductive material 304 from the horizontal surfaces and leave the sidewall spacer material 306 with gaps 307 therebetween.

Figure 4:
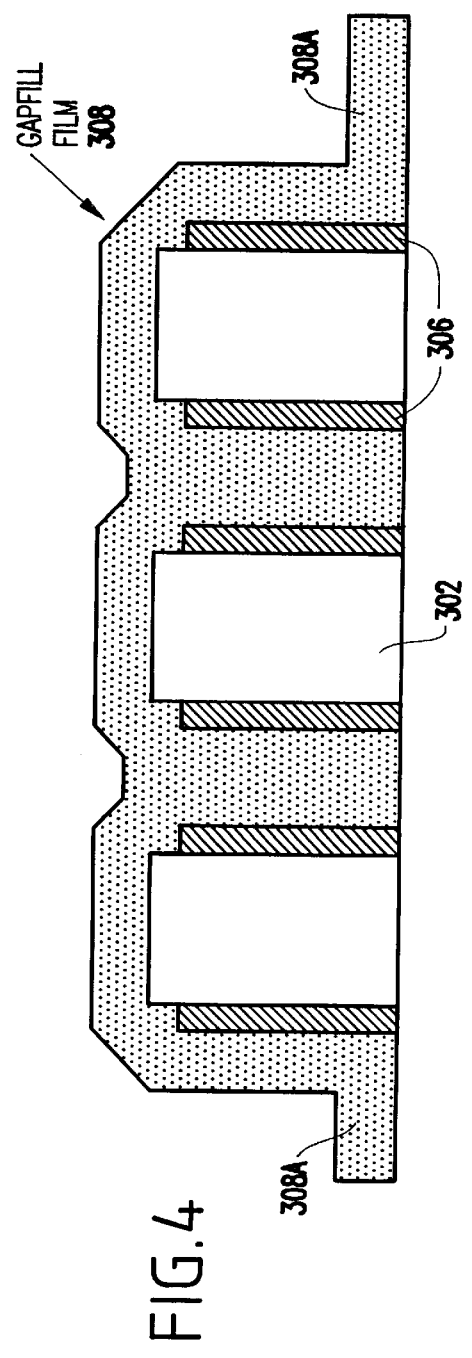

In FIG. 4, a conformal (blanket) gapfill blocking film 308 is deposited which fills between the gaps 307 (e.g., spaces) in the array. A chemical vapor deposition (CVD) film such as boron-doped glass (e.g., boro-phosphorous silicate glass (BPSG)) may be used as a the conformal gapfill blocking film 308. In lieu of the BPSG, a dielectric, a photoresist, a polymer such as polyimide, a spin-on-glass (SOG), a CVD diamond, etc. can be employed as the gapfill blocking film 308. It is noted that, for simplicity, the mandrel 302 could be formed of the same material as the gapfill blocking film. Since the gap is relatively small, the gap is rapidly filled with the film 308. As shown in FIG. 4, the outer ends of the film 308 on the outermost spacers 306 have an L-shape including a leg 308A.

In FIG. 5, the gapfill film 308 is optionally anisotropically (e.g., directionally) etched to remove the bulk of the gapfill film 308, especially the leg 308A of the L-shaped structure on the ends of the outer sidewall spacers. The etch does not affect the mandrel (assuming the mandrel is formed of a different material from the gapfill).

Then, in FIG. 6, the gapfill film 308 is isotropically partially removed by etching. As noted by the plurality of arrows, the isotropic etch is performed equally in all dimensions (directions) at a same rate, as is known by one of ordinary skill in the art. The gapfill film is partially etched so that it will remain in the gaps 307 (spaces) in the array. Thus, the gapfill film 308, as a result of the isotropic etch, will have recessed characteristic in the gap. A wet etch such as an HF-containing solution may be used for this step which is selective to the spacer material 306.

Further, a so-called "downstream plasma etch" could be employed in which no power (or low power) is applied to the anode and the cathode of a radio frequency (RF) device, but in which the radical ions serve to perform the etch. That is, a plasma is created in a chamber. Since there is some RF power device inside the chamber, many ions bombard at the surface of the subject and enhance the vertical etch rate. Downstream plasma creates the radicals (ions) which are very reactive, and these radicals are applied (flow) to a downstream chamber in which no (or low) power is applied to the anode and cathode of a device. In this downstream chamber, these reactive ions will etch similarly to a wet etch (e.g., a time-controlled wet etch) in a non-directional manner.

Once again, it is noted that the anisotropic etch of FIG. 5 is optional. Thus, the process could isotropically etch the structure of FIG. 4, to obtain the structure in FIG. 6.

In FIG. 7, an isotropic etch is used to remove the spacer material which is not masked by the remaining gapfill film 308. An isotropic wet or dry etch may be used for this step. The exposed spacer material 306 along the loops (e.g., shown as reference numerals 101C, 101D in FIG. 2) is removed during this step.

In FIG. 8, the gap fill 308 and/or mandrel film 302 may optionally be removed by a wet or dry etch which is selective to the spacer material 306. It is noted that the invention is very flexible and robust.

For example, if the gapfill material is different from the mandrel material, then the gapfill material can be selectively removed. By the same token, if the gapfill material is the same as the mandrel material, then the gapfill material need not be removed and can be left in place as a dielectric isolation.

Figure 9:
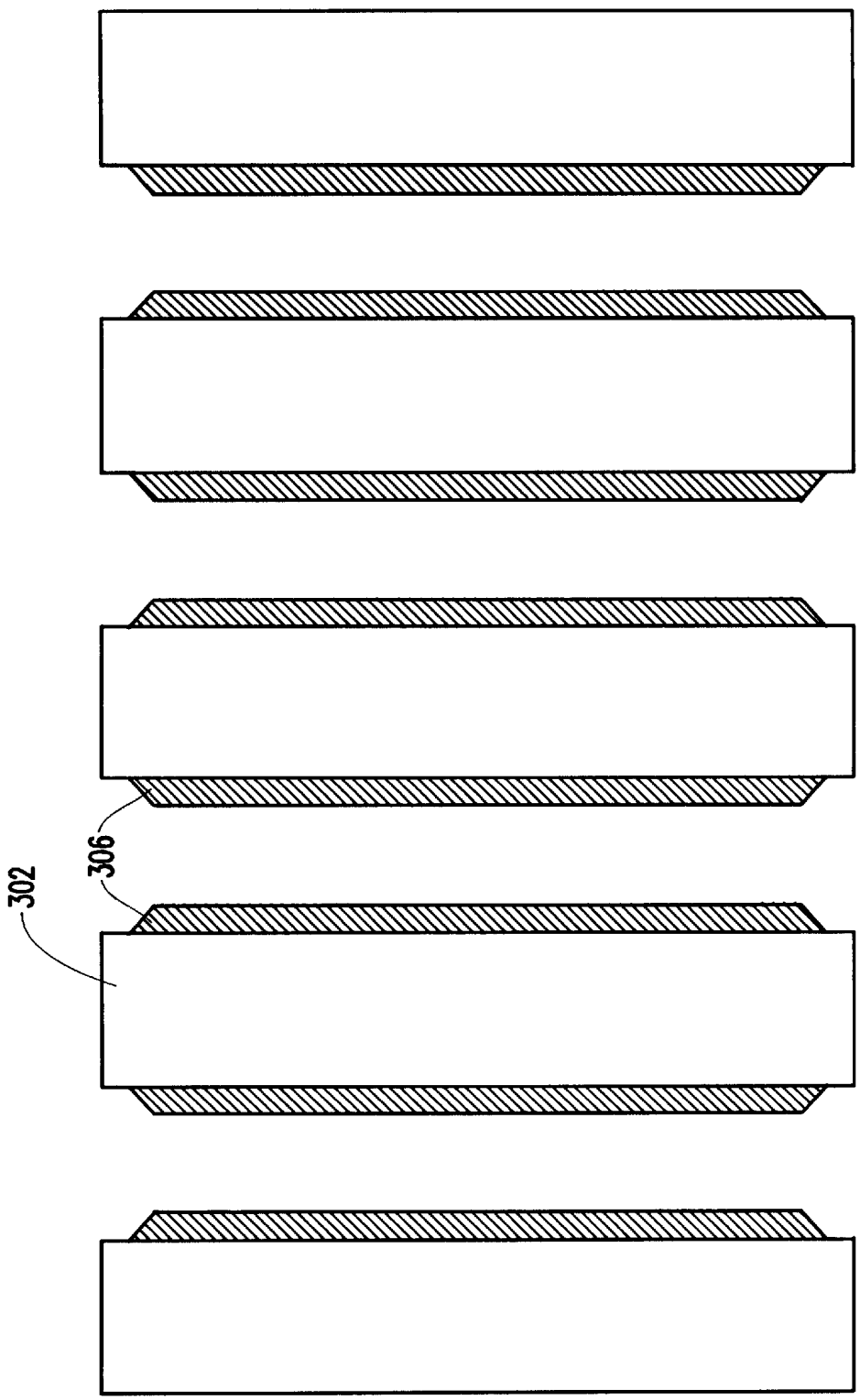

In FIG. 9, a top (plan) view is shown of the completed structure with the mandrel 302 in place.

Those skilled in the art will recognize that the sidewall spacer material may be a conductive film, as described above, or alternatively it may serve as a mask to pattern a prior level underlayer film, or an insulating material, etc. The line and space masking widths in the step shown in FIG. 3A (e.g., the lithography and etch of the mandrel) may be selected to provide a final equal line spacing of the sidewall spacer film.

The invention has many applications. For example, the half-pitch conductor with trim can be advantageously used with the bitline wiring level for a compact dynamic random access memory (DRAM) array.

Thus, with the unique and unobvious features of the present invention, the dedicated masking level required for edge trim of on-half sidewall spacer conductors is easily and efficiently solved by the invention. That is, the invention uses nested (versus isolated) feature process characteristic to trim a boundary region.

Besides the line-space pattern in the example given above, the method also can be applied to conduct self-trimming on any other densely packed patterns, for example, "fish bone" or "comb" patterns. This method can also be implemented to trim any densely packed patterns.

While the invention has been described in terms of a preferred embodiment, those skilled in the art will recognize that the invention can be practiced with modification within the spirit and scope of the appended claims.

For example, unlike the example above, the material of the mandrel and the gapfill material could be the same. Additionally, the spacer need not be conductive metal, polysilicon etc., but instead may be an insulative/dielectric material. In such a case, the mandrel may be a conductive material.

Additionally, while the example above has been directed to a semiconductor device for a memory (e.g., a DRAM), other applications would find equal benefit from the invention for forming any sub-lithographic patterns on any type of substrate. For example, the invention could utilize a dielectric as a spacer, and a conductive material for the mandrel, and the dielectric spacer would be beneficial for optical application purposes such as gratings, optical lines for fiber optics for conducting photons, etc. Thus, the above exemplary application should not be taken as limiting the invention to the specific method/structure disclosed above.

What is claimed is:

1. A method of self-trimming a pattern, comprising:
   forming a pattern containing a plurality of densely packed features using a first material deposited on a substrate;
   forming sidewall spacers using a second material along the sidewalls of said pattern in said first material;
   depositing and etching back a third material, such that said third material covers a portion of said sidewall spacers; and
   etching, without a mask, to remove said sidewall spacers exposed to an outer edge and not covered by said third material,
   wherein said pattern is a looped pattern.

2. A method of self-trimming a pattern, comprising:
   forming a pattern within a first material deposited on a substrate;
   depositing a conformal layer of a second material;
   etching said second material to form spacers of said second material along the sidewalls of predetermined patterns in said first material; and
   depositing and etching back, without a mask, a conformal layer of a third material to fully expose the spacers at exterior boundaries.

3. The method of claim 2, wherein said etching comprises an anisotropic etching.

4. The method of claim 2, wherein a pitch of said first material and said spacer pattern is 2F representing two minimum non-phase shift, lithographically-patternable feature sizes.

5. The method of claim 2, wherein a pitch of adjacent spacers in a spacer pair is 1F representing one minimum non-phase shift, lithographically-patternable feature size.

6. The method of claim 2, wherein said method is devoid of a distinct lithographic masking level to trim loop regions of the spacers.

7. The method of claim 2, wherein said substrate comprises a dielectric.

8. The method of claim 2, wherein said method is for producing a half-pitch conductor with trim for a bitline wiring level for a dynamic random access memory (DRAM) array.

9. The method of claim 2, wherein said sidewalls of predetermined patterns comprises a looped pattern.

10. The method of claim 2, wherein said predetermined patterns comprise line patterns.

11. The method of claim 2, wherein said depositing and etching back partially exposes the spacers between adjacent lines of said first material.

12. The method of claim 2, wherein said pattern contains a plurality of lines and spaces.

13. The method of claim 12, further comprising:
    depositing a third material to fill said spaces of said pattern in said first deposited material.

14. The method of claim 13, wherein said first material and said third material comprise a same material.

15. The method of claim 2, wherein said first material comprises one of silicon dioxide and silicon nitride for forming a mandrel.

16. The method of claim 15, wherein said second material comprises an electrically conductive material.

17. The method of claim 16, wherein said electrically conductive material comprises at least one of Al, W, TiN, Cu, TiW, Ta, and alloys thereof.

18. The method of claim 2, wherein said second material comprises an electrically conductive material.

19. The method of claim 18, wherein said electrically conductive material comprises polysilicon.

20. The method of claim 2, wherein said first material comprises a conductive material and said second material comprises an electrically insulating material.

21. The method of claim 20, wherein said electrically insulating material comprises one of silicon nitride and silicon dioxide.

22. The method of claim 2, further comprising depositing a conformal gapfill blocking film between a gap between adjacent spacers.

23. The method of claim 22, wherein said conformal gapfill blocking film comprises a chemical vapor deposition (CVD) film.

24. The method of claim 23, wherein said CVD film comprises boro-phosphorous silicate glass (BPSG).

25. The method of claim 22, wherein said gapfill blocking film comprises at least one of a dielectric, a photoresist, a polymer, a spin-on-glass (SOG), a chemical vapor deposited (CVD) diamond, and boro-phosphorous silicate glass (BPSG).

26. A method comprising:
   forming a pattern within a first material deposited on a substrate;
   depositing a conformal layer of a second material;
   etching said second material to form spacers of said second material along the sidewalls of predetermined patterns in said first material;
   depositing a third material to fill said spaces of said pattern in said first deposited material;
   etching back said third deposited fill material to expose the spacers at exterior boundaries, said etching back partially removing said third deposited material from between adjacent lines of said first material;
   removing said exposed spacers via an etching; and
   stripping the remaining said third deposited fill material,
   wherein said pattern contains a plurality of lines and spaces.

27. A method of self-trimming a pattern, comprising:
   forming a pattern within a first material deposited on a substrate;
   depositing a conformal layer of a second material;
   etching said second material to form spacers of said second material along the sidewalls of predetermined patterns in said first material;
   depositing a conformal gapfill blocking film between a gap between adjacent spacers; and
   isotropically partially removing the gapfill blocking film by etching, wherein said etching is selective to the spacer material.

28. The method of claim 27, further comprising;
   removing, via an isotropic etch, the spacer material which is not masked by the remaining gapfill blocking film, such that a predetermined exposed spacer material along the pattern is removed.

29. A method comprising:
   forming a pattern within a first material deposited on a substrate;
   depositing a conformal layer of a second material;
   etching said second material to form spacers of said second material along the sidewalls of predetermined patterns in said.first material;
   depositing a third material to fill said spaces of said pattern in said first deposited material; and
   removing at least one of the third material and the first material by etching selective to the spacer material,
   wherein said pattern contains a plurality of lines and spaces.

* * * * *